(12) United States Patent
Otsuki (10) Patent No.: US 6,583,492 B2
(45) Date of Patent: Jun. 24, 2003

(54) CAPACITOR ELEMENT HAVING A CONTACT HOLE STRUCTURE IN AN ELECTRODE STRUCTURE

(75) Inventor: Kazutaka Otsuki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/254,399

(22) Filed: Sep. 25, 2002

(65) Prior Publication Data
US 2003/0057466 A1 Mar. 27, 2003

(30) Foreign Application Priority Data
Sep. 26, 2001 (JP) .......................... 2001-294906

(51) Int. Cl.[7] .............................. H01L 29/00
(52) U.S. Cl. ...................... 257/535; 257/532
(58) Field of Search ................ 257/532, 534, 257/535, 311

(56) References Cited

U.S. PATENT DOCUMENTS

| | | | | |
|---|---|---|---|---|
| 5,606,197 A | * | 2/1997 | Johansson et al. | 257/532 |
| 6,177,716 B1 | * | 1/2001 | Clark | 257/532 |
| 6,340,832 B2 | * | 1/2002 | Kasahara | 257/532 |
| 2002/0030243 A1 | * | 3/2002 | Mikawa et al. | 257/532 |

FOREIGN PATENT DOCUMENTS

| | | |
|---|---|---|
| JP | 10-4179 | 1/1998 |
| JP | 11-307745 | 11/1999 |

* cited by examiner

Primary Examiner—Ngân V. Ngô
(74) Attorney, Agent, or Firm—Choate, Hall & Stewart (57) ABSTRACT

A semiconductor device comprising a first electrode and a second electrode that are formed in this order on a semiconductor substrate with an insulating layer interposed between the first and second electrodes. A contact hole is provided for connecting the second electrode to a wiring layer formed above the second electrode, the contact hole being formed at a position above a separated region of the first electrode formed separately from a main region of the first electrode.

6 Claims, 6 Drawing Sheets

CAPACITOR ELEMENT HAVING A CONTACT HOLE STRUCTURE IN AN ELECTRODE STRUCTURE

BACKGROUND OF THE INVENTION

1. Field of the Invention

The present invention relates to a semiconductor device and, more particularly, to electrode structure comprising upper and lower layers that are superposed on another, and to a contact hole structure in the electrode structure.

2. Description of the Prior Art

In recent years, semiconductor devices having an increased number of functions have been developed and a demand has arisen for heterogeneous devices in which a memory circuit and a logic circuit or an analog circuit are integrated at a high density with accuracy. Capacitor elements formed with higher density and higher precision are necessary, for example, for analog circuits in such heterogeneous devices. Also, it is necessary to mount a boosting circuit in a nonvolatile semiconductor storage device such as an electrically erasable programmable read-only memory (EEPROM) or a flash memory. A capacitor element of a large area is required as a component of a charge pump circuit constituting the boosting circuit. It is necessary to construct such a capacitor element in such a manner that electrode layers are laid one on another to form opposed electrodes, and each of the opposed electrodes is connected to wiring via a contact hole.

Various techniques, e.g., those disclosed in Japanese Patent Laid-open Publication Nos. 11-30774 and 10-004179 have been proposed as a method for forming the capacitor element in the above-described flash memory. Such conventional techniques will be described with reference to FIGS. 4, 5, and 6. In these figures, a lower layer electrode compared with an electrode in accordance with the present invention is indicated by hatching to be clearly recognized.

Figure 4A:
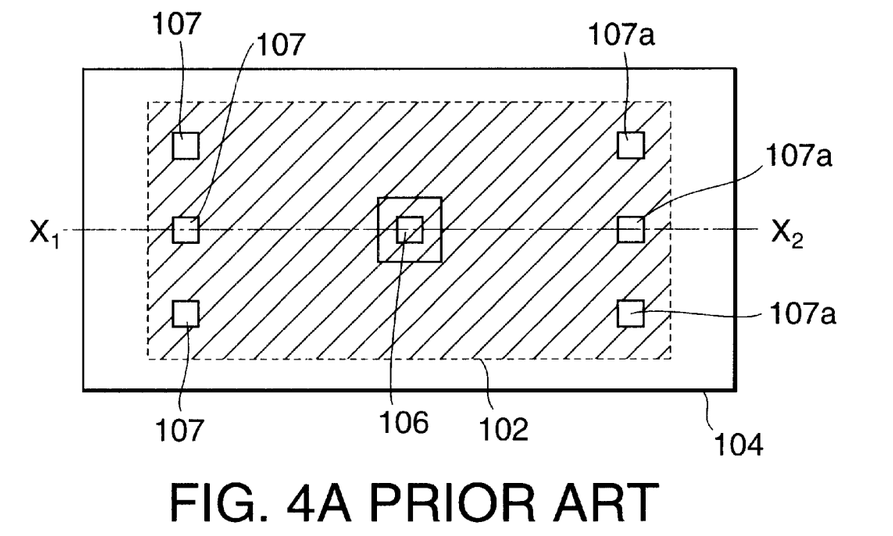
FIGS. 4A and 4B are a plan view and a cross-sectional view, respectively, of a capacitor element for explaining a technique in a first example of the conventional art.
Figure 4B:
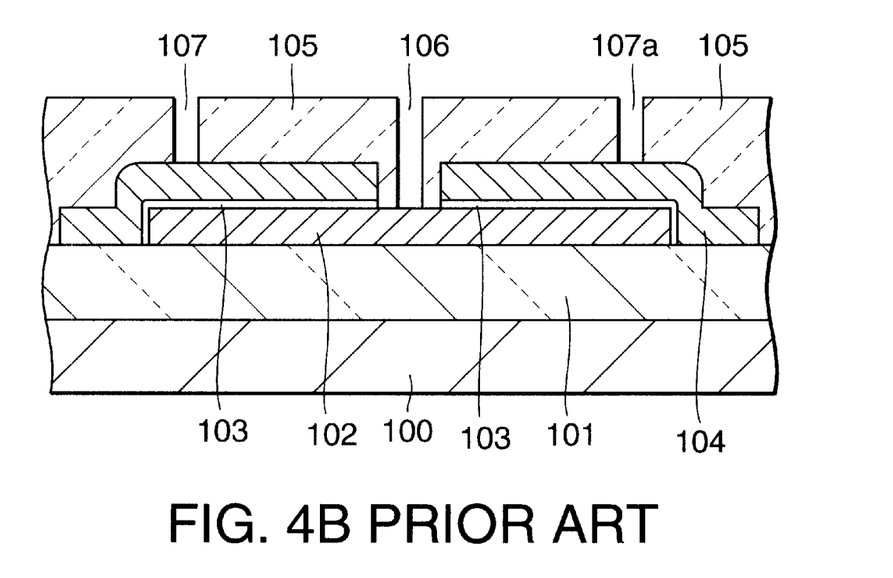

FIGS. 4A and 4B are a plan view and a cross-sectional view, respectively, of a first example of the conventional capacitor element. The cross-sectional view of FIG. 4B is taken along the line X1–X2 in FIG. 4A.

As shown in FIGS. 4A and 4B, an element separation insulating film 101 is formed on a silicon substrate 100, and a lower layer electrode 102 is formed by patterning on the element separation insulating film 101. The lower layer electrode 102 is formed from polycrystalline silicon containing an impurity. A capacitor insulating film 103 is formed on the surface of the lower layer electrode 102. An upper layer electrode 104 is formed by patterning so as to cover the lower layer electrode 102 and the capacitor insulating film 103. The upper layer electrode 104 is also formed from polycrystalline silicon containing an impurity.

An interlayer insulating film 105 is then deposited on the entire surface by chemical vapor deposition (CVD) and the surface of the insulating film 105 is flattened by chemical mechanical polishing (CMP). A lower layer electrode contact hole 106 is formed in a predetermined region of the interlayer insulating film 105. A plurality of upper layer electrode contact holes 107 and 107a are also formed, as shown in FIGS. 4A and 4B. Specifically, the upper layer electrode contact holes 107 and 107a are formed in the region right above the lower layer electrode 102.

Plugs (not shown) are formed so as to fill the lower layer electrode contact hole 106 and the upper layer electrode contact holes 107 and 107a and are electrically connected to wiring points (not shown), thus forming the capacitor element.

Figure 5A:
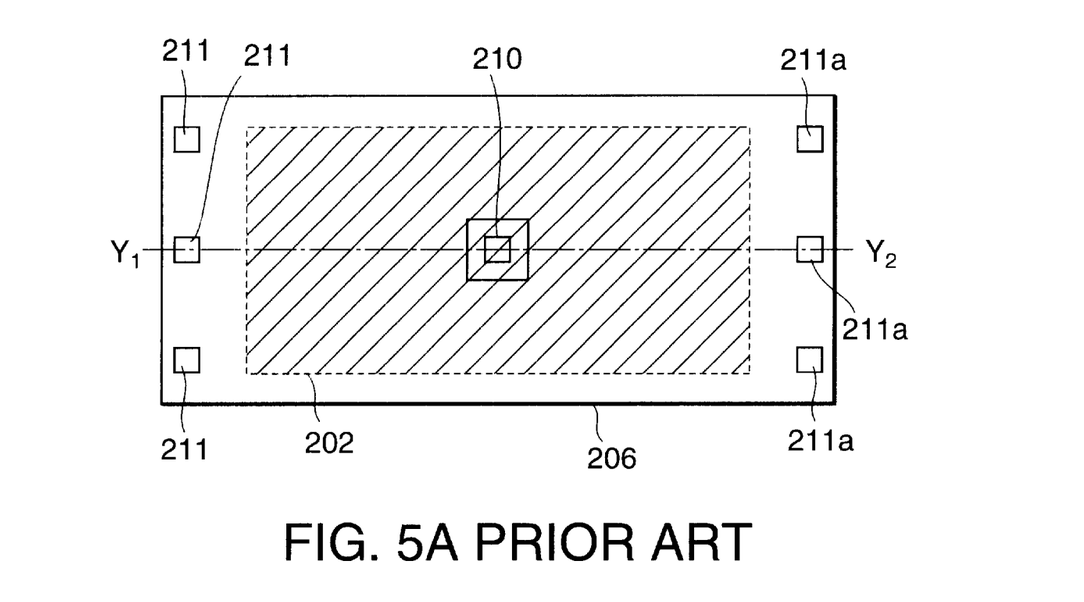
FIGS. 5A and 5B are a plan view and a cross-sectional view, respectively, of a capacitor element for explaining a technique in a second example of the conventional art.
Figure 5B:
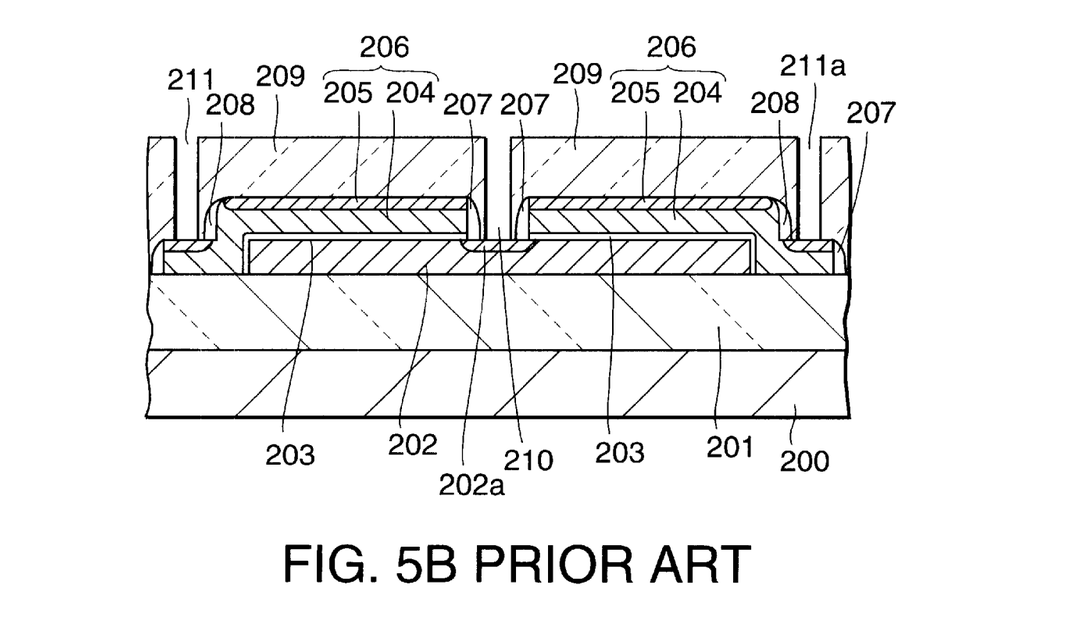
Figure 6:
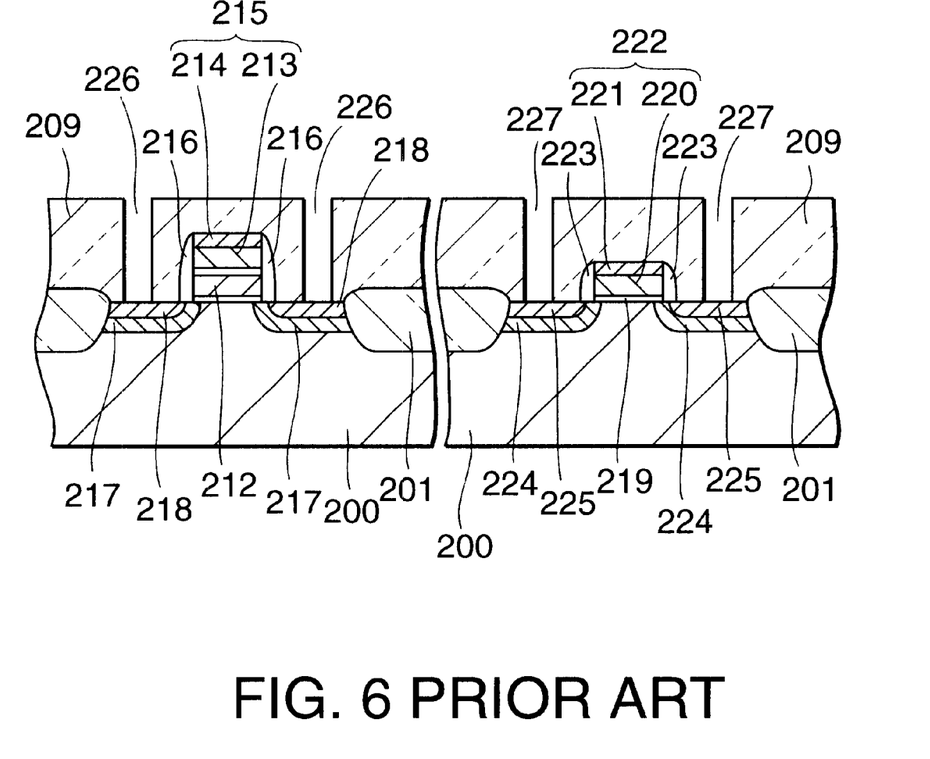
FIG. 6 is a cross-sectional view of a floating-gate MOS transistor and an ordinary MOS transistor for explaining the technique in the second example of the conventional art.

FIGS. 5A and 5B are a plan view and a cross-sectional view, respectively, of a second example of the conventional capacitor element. The cross-sectional view of FIG. 5B is taken along the line Y1–Y2 in FIG. 5A. A major difference of the second example of the conventional capacitor element from the first example resides in that a silicide is formed as a low-resistance portion in the surface of the above-described upper layer electrode of the first example. FIG. 6 schematically shows in section the structure of a floating-gate MOS transistor and an ordinary MOS transistor for explanation of this silicification.

As shown in FIGS. 5A and 5B, an element separation insulating film 201 is formed on a silicon substrate 200 and a lower layer electrode 202 is formed by patterning, as in the first example of the conventional capacitor element. The lower layer electrode 202 is formed from polycrystalline silicon containing an impurity, and a silicide layer 202a is formed as a portion of the lower layer electrode 202. A capacitor insulating film 203 is formed on the surface of the lower layer electrode 202. An upper layer electrode 206 is formed in a multilayer structure such that a polycrystalline silicon layer 204 and a silicide layer 205 are formed by patterning so as to cover the lower layer electrode 202 and the capacitor insulating film 203. A side wall insulating film 207 is formed on patterned ends of the upper layer electrode 206. This side wall insulating film 207 is formed of a silicon oxidation film. A side wall insulating film 208 is formed on stepped portions of the polycrystalline silicon layer 204 formed at ends of the lower layer electrode 202, as shown in FIG. 5B. The formation of the silicide layer and the side wall insulating films will be described in detail with reference to FIG. 6.

An interlayer insulating film 209 is formed on the entire surface, as is that in the first example of the conventional capacitor element. Further, a lower layer electrode contact hole 210 is formed in a predetermined region of the interlayer insulating film 209. A plurality of upper layer electrode contact holes 211 and 211a are also formed, as shown in FIGS. 5A and 5B. Specifically, the upper layer electrode contact holes 211 and 211a are formed off the region right above the lower layer electrode 202.

Plugs are formed so as to fill the lower layer electrode contact hole 210 and the upper layer electrode contact holes 211 and 211a and are electrically connected to wiring points, as are those in the first example of the conventional capacitor element. The second example of the conventional capacitor element is thus formed.

The above-mentioned silicification will next be described. FIG. 6 schematically shows in section the structure of a floating-gate MOS transistor and an ordinary MOS transistor. The capacitor element shown in FIGS. 5A and 5B is formed on the silicon substrate simultaneously with the floating-gate MOS transistor and the ordinary MOS transistor shown in FIG. 6.

That is, device separation insulating film 201 is formed on silicon substrate 200, and a floating-gate electrode 212 is formed in the floating-gate MOS transistor with an tunnel oxide film interposed between the substrate and the floating-gate electrode 212. A polycrystalline silicon layer 213 is formed on the floating-gate electrode 212 with an interelectrode insulating film interposed therebetween, and a silicide layer 214 is formed on the polycrystalline silicon layer 213. The polycrystalline silicon layer 213 and the silicide layer 214 forms for a control gate electrode 215. A side wall insulating film 216 is formed on side wall surfaces of the floating-gate electrode 212 and the control gate electrode

215. The electrodes, etc., are thus constructed. Further, a diffusion layer 217 for forming source and drain regions of the floating-gate MOS transistor is formed and a silicide layer 218 is formed in an upper portion of the diffusion layer 217.

Similarly, in the ordinary MOS transistor, a polycrystalline silicon layer 220 is formed on a gate insulating film 219 and a silicide layer 221 is formed in an upper portion of the polycrystalline silicon layer 220. The polycrystalline silicon layer 220 and the silicide layer 221 form a gate electrode 222. A side wall insulating film 223 is formed on side wall surfaces of the gate electrode 222. Further, a diffusion layer 224 for forming source and drain regions of the MOS transistor is formed and a silicide layer 225 is formed in an upper portion of the diffusion layer 224.

Contact holes 226 for the floating-gate MOS transistor and contact holes 227 for the ordinary MOS transistor are formed in predetermined regions of the interlayer insulating film 209 covering the entire surface.

The lower layer electrode 202 of the capacitor element shown in FIG. 5 is formed of the same polycrystalline silicon film as the floating gate electrode 212 of the floating-gate MOS transistor. The polycrystalline silicon layer 204 constituting the upper layer electrode 206 is formed of the same polycrystalline silicon film as the polycrystalline silicon layer 213 of the floating-gate MOS transistor and the polycrystalline silicon layer 220 of the ordinary MOS transistor. The silicide layer 205 or 202*a* is formed simultaneously with the silicide layers 214 and 218 of the floating-gate MOS transistor and the silicide layers 221 and 225 of the ordinary MOS transistor by a silicification technique for silicification of these silicide layers. In this silicification technique, forming of side wall insulating films 216 and 223 is necessary. Therefore side wall insulating films 207 and 208 are necessarily formed on the patterned ends or stepped portions of the upper layer electrode 206 shown in FIGS. 5A and 5B. Also, the lower electrode contact hole 210 and the upper layer electrode contact holes 211 and 211*a* of the capacitor element shown in FIGS. 5A and 5B are formed by the same etching process as that for forming the contact holes 226 of the floating-gate MOS transistor and the contact holes 227 of the ordinary MOS transistor.

The above-described conventional techniques for forming capacitor elements have problems described below. In the process of manufacturing the first example of the conventional capacitor element described above with reference to FIGS. 4A and 4B, the insulation between the upper layer electrode 104 and the lower layer electrode 102 becomes deteriorated. The following is a possible explanation of this phenomenon. In the first example of the conventional capacitor element, the upper layer electrode contact holes 107 and 107*a* are formed in the region above the lower layer electrode 102. After the formation of these contact holes, native oxide film is removed by a process step using a dilute hydrofluoric acid solution in order to reduce the resistance of contact to the plugs filling the contact holes. In this process step, however, the dilute hydrofluoric acid solution permeates through grain boundaries in the polycrystalline silicon film constituting the upper layer electrode 104 to corrode the capacitor insulating film 103 below the upperlayer electrode 104. The insulating effect of portions of the capacitor insulating film below the upper layer electrode contact holes 107 and 107*a* is reduced by this corrosion.

In the second example of the conventional capacitor element described above with reference to FIGS. 5A and 5B, the upper layer electrode contact holes 211 and 211*a* are formed off the patterned area of the lower layer electrode 202 unlike those in the first example. Therefore the second example of the conventional capacitor element has no problem such as that described with respect to the first example. However, when the silicide layer 205 constituting the upper layer electrode 206 in the second example of the conventional capacitor element is formed, it cannot be formed entirely continuously, so that the resistance of the upper layer electrode 206 cannot be sufficiently reduced. That is, as shown in FIG. 5B, side wall insulating film 208 is necessarily formed on stepped portions of the polycrystalline silicon layer 204 that occur at the ends of the lower layer electrode 202 pattern. In the above-described silicification step, the silicide layer cannot be formed in the region covered with this side wall insulating film 298. A reduction in the effect of reducing the resistance due to failure to completely form the silicide layer leads to a considerable reduction in the performance of a charge pump circuit formed by using this capacitor element.

BRIEF SUMMARY OF THE INVENTION

1. Objects of the Invention

An object of the present invention is to provide a semiconductor device in which the performance and reliability of insulation with an insulating film formed between a lower layer electrode and an upper layer electrode in a capacitor element for example are high. Another object of the present invention is to provide a semiconductor device in which the resistance of the above-described upper layer electrode or lower layer electrode can be reduced highly controllably.

2. Summary of the Invention

According to the present invention, there is provided a semiconductor device in which a first electrode and a second electrode are formed in this order in a multilayer structure on a semiconductor substrate with an insulating layer interposed between the first and second electrodes, a contact hole for connection of the second electrode to a wiring layer formed above the second electrode being formed at a position above a separated region of the first electrode formed separately from a main region of the first electrode.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
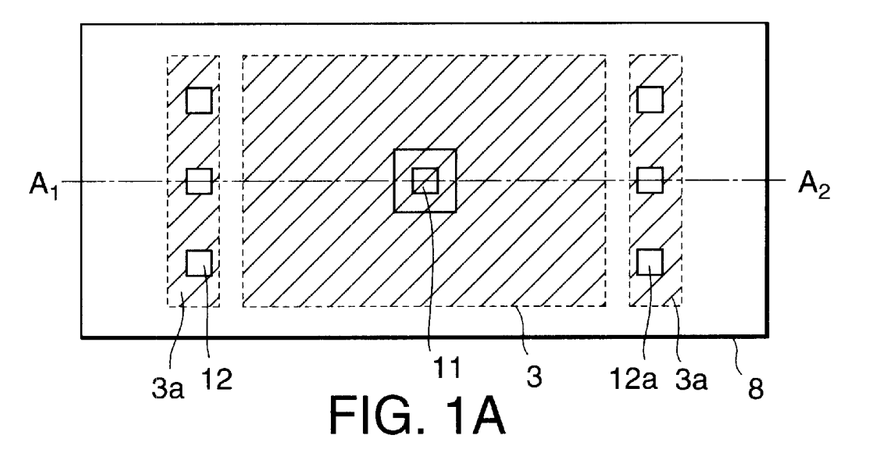
FIGS. 1A and 1B are a plan view and a cross-sectional view, respectively, of a capacitor element which represents a first embodiment of the present invention.
Figure 1B:
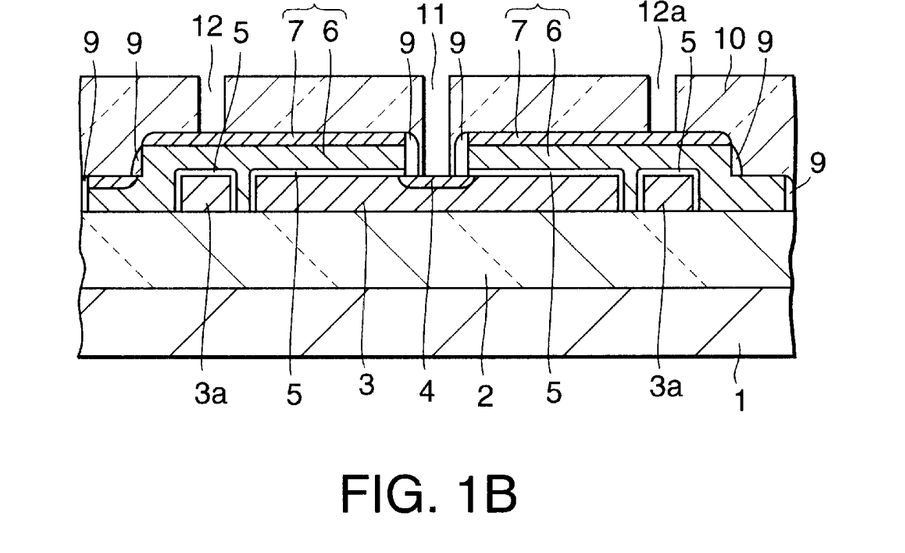

A first embodiment of the present invention will be described with reference to FIGS. 1A and 1B. FIGS. 1A and 1B are a plan view and a cross-sectional view, respectively, of a capacitor element. The cross-sectional view of FIG. 1B is taken along the line A1–A2 in FIG. 1A. In FIGS. 1A and 1B, a lower layer electrode 3 is indicated by hatching to enable the present invention to be clearly understood.

As shown in FIGS. 1A and 1B, an element separation insulating film 2 is formed on a silicon substrate 1, and the lower layer electrode 3, which is a patterned first electrode, is formed and a silicide layer 4 is formed as a portion of the lower layer electrode 3. According to the present invention, separated regions 3a of the lower layer electrode 3 are formed separately from a main region of the lower layer electrode 3. The main region and the separated regions 3a of the lower layer electrode 3 are formed by patterning a polycrystalline silicon film containing aphosphoric impurity at a concentration of $10^{19}$ to $10^{20}$ atoms/cm$^3$. The thickness of the polycrystalline silicon film is about 200 nm.

A capacitor insulating film 5 is formed on the surfaces of the main region and the separated regions 3a of the lower layer electrode 3. The capacitor insulating film 5 is formed as silicon oxide film/silicon nitride film/silicon oxide film (hereinafter referred to as "ONO film") in a multilayer structure. The thickness of the capacitor insulating film 5 is about 15 nm in terms of the thickness of silicon oxide film.

A polycrystalline silicon layer 6 and a silicide layer 7 are formed by patterning so as to cover the main region and separated regions 3a of the above-described lower layer electrode 3 and the capacitor insulating film 5. An upper layer electrode 8 is thereby formed in a multilayer structure as a second electrode. The polycrystalline silicon layer 6 is deposited by CVD so as to completely fill the space between the main region and separated regions 3a of the lower layer electrode 3. The distance by which the main region and each separated region 3a of the lower layer electrode 3 are separated from each other is set to a value not larger than twice the film thickness of the polycrystalline silicon layer 6. A side wall insulating film 9 is formed on patterned ends of the upper layer electrode 8 and on stepped portions of the polycrystalline silicon layer 6 formed at ends of the separated regions 3a. The side wall insulating film 9 is formed of a silicon oxide film.

An interlayer insulating film 10 is formed on the electrode layer and side wall layer formed as described above. A lower layer electrode contact hole 11 is formed in a predetermined region of the interlayer insulating film 10. Simultaneously, a plurality of upper layer electrode contact holes 12 and 12a are formed as shown in FIGS. 1A and 1B. Specifically, the upper layer electrode contact holes 12 and 12a are formed at positions set above the separated regions 3a.

Thereafter, plugs are formed so as to fill the lower layer electrode contact hole 11 and the upper layer electrode contact holes 12 and 12a and are electrically connected to wiring points, as described above with respect to the conventional art. The capacitor element of the present invention is thus formed.

If the upper layer electrode/lower layer electrode structure of the present invention is used, the performance and reliability of insulation with an insulating film formed between the lower layer electrode and the upper layer electrode as in the above-described conventional capacitor element can be remarkably improved. Since in the structure in accordance with the present invention the upper layer electrode contact holes 12 and 12a are formed at positions above the separated regions 3a, the performance of the insulation between the lower layer electrode 3 and the upper layer electrode 8 is not changed even if the insulating performance of the capacitor insulating film 5 on the surface of the separated regions 3a becomes deteriorated as in the first example of the conventional capacitor element.

Also, if the structure in accordance with the present invention is used, the resistance of the upper layer electrode 8 can be reduced highly controllably by the method described above with respect to the second example of the conventional capacitor element. That is, according to the present invention, the upper layer electrode contact holes 12 and 12a are formed at positions above the lower layer electrode 3 unlike those in the second example of the conventional capacitor element, so that the resistance of the upper layer electrode 8 is not influenced by the above-described absence of silicide at the stepped portions.

Figure 2A:
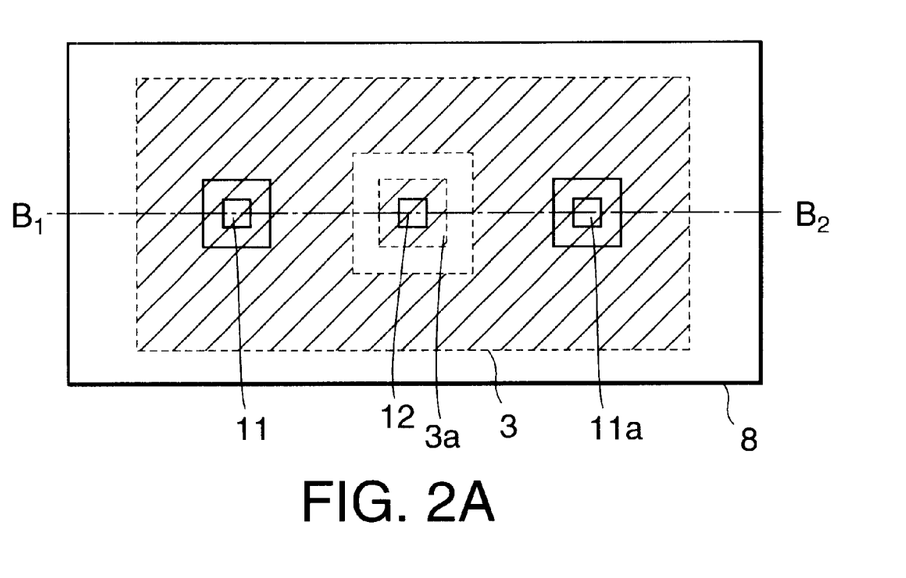
FIGS. 2A and 2B are a plan view and a cross-sectional view, respectively, of another capacitor element which represents a second embodiment of the present invention.
Figure 2B:
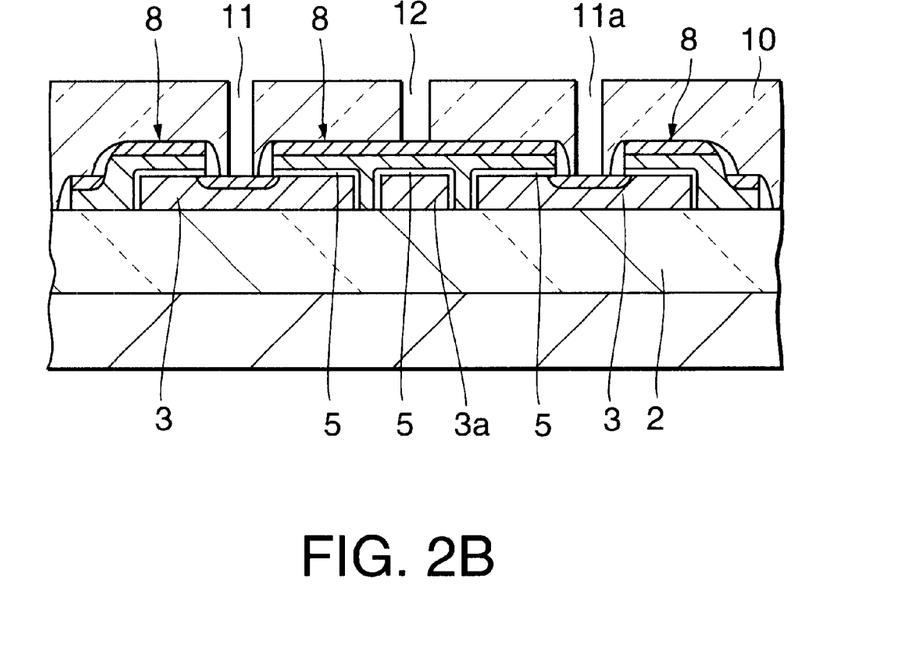

A second embodiment of the present invention will be described with reference to FIGS. 2A and 2B. FIGS. 2A and 2B are a plan view and a cross-sectional view, respectively, of a capacitor element. The cross-sectional view of FIG. 2B is taken along the line B1–B2 in FIG. 2A. The second embodiment of the present invention differs from the first embodiment in the positional relationship between a lower layer electrode, an upper layer electrode, and a separated region. The second embodiment will be described mainly with respect to points of difference from the first embodiment. Like reference characters refer to the same parts as those of the structure described in the first embodiment.

As shown in FIGS. 2A and 2B, a separated region 3a provided on an interlayer insulating film 2 is formed at the center of a lower layer electrode 3, and an upper layer electrode 8 is formed in a multilayer structure on the lower layer electrode 3 with a capacitor insulating film 5 interposed therebetween. Through an interlayer insulating film 10, lower layer electrode contact holes 11 are on the lower layer electrode 3, and an upper layer electrode 12 is on the upper layer electrode 8. Also in this embodiment, the upper layer electrode contact hole 12 is formed at a position above the separated region 3a. In other respects, the structure of the second embodiment is the same as that in the first embodiment.

In the second embodiment, the same effect as that described with respect to the first embodiment is obtained. In the second embodiment, the area of the lower layer electrode 3 is increased relative to that in the first embodiment due to the difference 5 in the arrangement, so that the capacitor elements in accordance with the second embodiment can be mounted at a higher density.

Figure 3A:
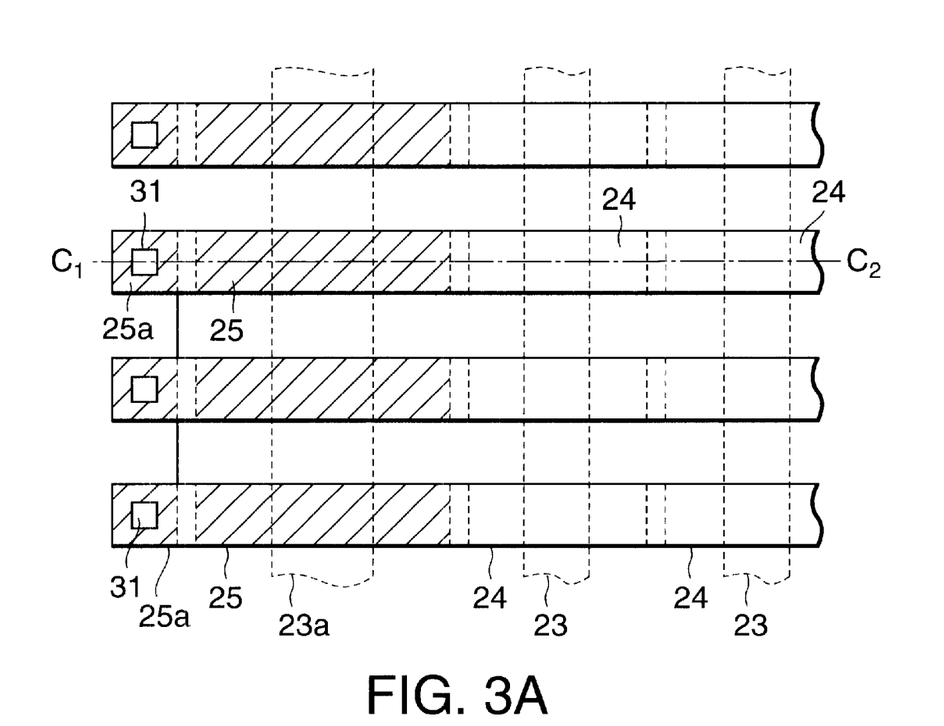
FIGS. 3A and 3B are a plan view and a cross-sectional view, respectively, of cell portions of a flash EEPROM which represents a third embodiment of the present invention.
Figure 3B:
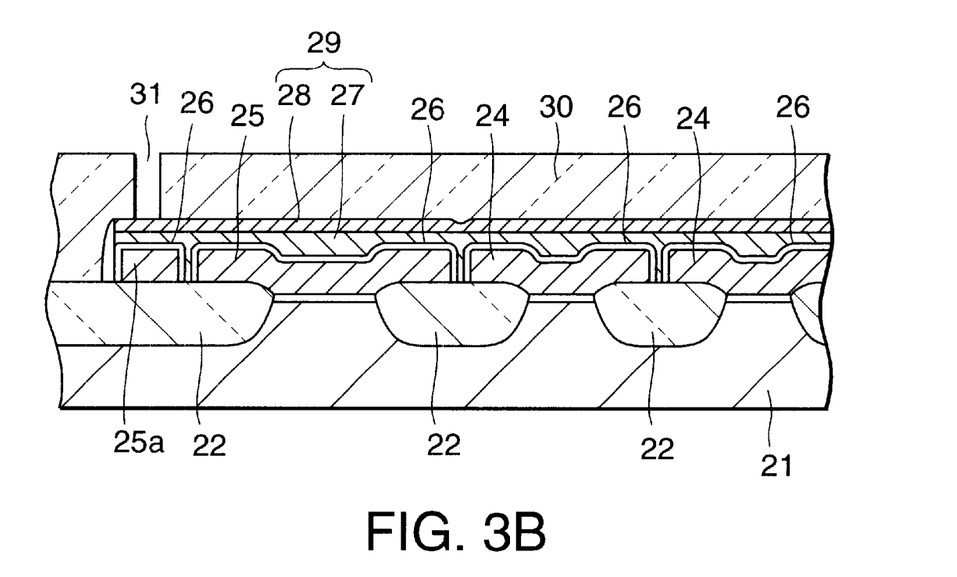

A third embodiment of the present invention will be described with reference to FIGS. 3A and 3B. FIGS. 3A and 3B are a plan view and a cross-sectional view, respectively, of end regions of flash EEPROM cells. The cross-sectional view of FIG. 3B is taken along the line C1–C2 in FIG. 3A. In this embodiment, an upper layer electrode and a lower layer electrode are formed as a word line and as a dummy electrode, respectively, unlike those of the capacitor element.

As shown in FIGS. 3A and 3B, element separation insulating film 22 is selectively formed in the surface of a silicon substrate 21, and floating-gate electrodes 24 of floating-gate MOS transistors are placed on element active regions 23 with a tunnel oxide film interposed therebetween. Similarly, in end sections of the cell regions, dummy electrodes 25 are placed on element active regions 23a with a tunnel oxide film interposed therebetween. A separated region 25a is formed separately from each main dummy region 25 on the element 25 separation insulating film 22. A capacitor insulating film 26 is formed on the surfaces of the floating gate electrodes 24, the dummy electrodes 25 and the separated regions 25a. The capacitor insulating film 26 is formed of an ONO film. The thickness of the capacitor insulating film 26 is about 15 nm in terms of the thickness of silicon oxide film.

Word lines are each formed in a multilayer structure by a polycrystalline layer 27 and a silicide layer 28 which are patterned so as to cover the capacitor insulating film 26. An interlayer insulating film 30 is formed on the entire surface of the above-described layers, and word line contact holes 31 are formed in predetermined regions of the interlayer insulating film 30. In this embodiment, as shown in FIGS. 3A and 3B, the word line contact holes 31 are formed at positions above the separated regions 25a. Also in this embodiment, the same effect as that described with respect to the first embodiment is achieved.

As described above, in the semiconductor device of the present invention, a lower layer electrode and an upper layer electrode are formed in this order in a multilayer structure on a semiconductor substrate with an insulating layer interposed between the upper layer and lower layer electrodes, and a contact hole for connection of the upper layer electrode to a wiring layer formed above the upper layer electrode is formed at a position above a separated region of the lower layer electrode. Also, the separated region is formed at an end of the lower layer electrode pattern. Alternatively, the separated region is formed at the center of the lower layer electrode pattern. The distance by which the main region and the separated region of the lower layer electrode are separated from each other is set to a value not larger than twice the film thickness of the upper layer electrode.

If the upper layer electrode/lower layer electrode structure of the present invention is used, the performance and reliability of insulation with an insulating film formed between a lower layer electrode and an upper layer electrode as in a capacitor element can be remarkably improved. Also, according to the present invention, a contact hole for contact with the second electrode, i.e., the upper layer electrode is formed above a separated region of the lower layer electrode, so that the resistance of the upper layer electrode is not influenced by the absence of silicide at the stepped portions due to the formation of a side wall insulating film. Consequently, the resistance of the upper layer electrode can be reduced highly controllably, in contrast with the above-described conventional art.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
    a semiconductor substrate;
    a first electrode and a second electrode formed in this order on said semiconductor substrate;
    an insulating layer interposed between said first and second electrodes,
    wherein a contact hole is provided for connecting said second electrode to a wiring layer formed above said second electrode, said contact hole being formed at a position above a separated region of said first electrode formed separately from a main region of said first electrode.

2. The semiconductor device according to claim 1, wherein said first electrode and said second electrode with said insulating layer interposed therebetween are opposed electrodes of a capacitor element, and said insulating layer is a capacitor insulating film of the capacitor element.

3. The semiconductor device according to claim 1, wherein said separated region is formed at an end of the pattern of said first electrode.

4. The semiconductor device according to claim 1, wherein said separated region is formed at the center of the pattern of said first electrode.

5. The semiconductor device according to claim 1, wherein a silicide layer is formed on the surface of at least one of said second electrode and said first electrode.

6. The semiconductor device according to claim 1, wherein the distance by which the main region and said separated region of said first electrode are separated from each other is set to a value not larger than twice the film thickness of said second electrode.

* * * * *